United States Patent
Pei et al.

(10) Patent No.: US 9,784,799 B2
(45) Date of Patent: Oct. 10, 2017

(54) MULTI-NODE SYNCHRONOUS ON-SITE TEST METHOD

(75) Inventors: Maolin Pei, Jiangxi (CN); Ping Sun, Jiangxi (CN); Chunqiang Zhang, Jiangxi (CN); Jian Liu, Jiangxi (CN); Haimei Hu, Jiangxi (CN); Ming Zhu, Jiangxi (CN)

(73) Assignee: JIANGXI ELECTRIC POWER SCIENCE RESEARCH INSTITUTE, Nanchang (CN)

( * ) Notice: Subject to any disclaimer, the term of this patent is extended or adjusted under 35 U.S.C. 154(b) by 687 days.

(21) Appl. No.: 14/378,954

(22) PCT Filed: May 2, 2012

(86) PCT No.: PCT/CN2012/000584
§ 371 (c)(1),
(2), (4) Date: Aug. 14, 2014

(87) PCT Pub. No.: WO2013/127034
PCT Pub. Date: Sep. 6, 2013

(65) Prior Publication Data
US 2015/0019156 A1   Jan. 15, 2015

(30) Foreign Application Priority Data
Feb. 28, 2012 (CN) .......................... 2012 1 0047147

(51) Int. Cl.
G01R 31/40 (2014.01)
H02J 13/00 (2006.01)
G01R 21/133 (2006.01)

(52) U.S. Cl.
CPC ........... G01R 31/40 (2013.01); G01R 21/133 (2013.01); H02J 13/0079 (2013.01)

(58) Field of Classification Search
None
See application file for complete search history.

(56) References Cited

FOREIGN PATENT DOCUMENTS

| CN | 1760686 | 4/2006 |
|---|---|---|
| CN | 2906632 | 5/2007 |

(Continued)

OTHER PUBLICATIONS

Ratan Das, Centralized Substation Protection and Control, Dec. 2015, 80 pages.*

(Continued)

*Primary Examiner* — Tung Lau
(74) *Attorney, Agent, or Firm* — Gokalp Bayramoglu

(57) ABSTRACT

A multi-node synchronous on-site test method, the method comprising: using GPS time as time reference, and conducting synchronous on-site tests on the devices to be tested and systems distributed at different places at an appointed time; controlling the synchronous phase control simulation devices distributed at multiple nodes via a synchronous test control center; within a uniform time section, synchronously outputting secondary side AC simulation signals, and simulating various actual operating conditions, thus achieving the detection of the monitoring and control performances of various dynamic monitoring and control systems, and ensuring the normal functions of the systems. The method of the present invention is able to conduct multi-node dynamic simulation test with synchronized GPS time, and achieves the detection of large-area multi-node monitoring and control systems. The present invention is suitable for the test of a wide area measurement system (WAMS) function, the simulation test of a damping control function, the simulation test of transiently stable state analysis and control functions, the simulation test of voltage stabilization and control functions, the simulation test of an islanding control function, the simulation test of wide area protection system functions and the like.

4 Claims, 2 Drawing Sheets

(56) References Cited

FOREIGN PATENT DOCUMENTS

| | | | | |
|---|---|---|---|---|
| CN | 101592695 | | 2/2009 | |
| CN | 101629995 | * | 1/2010 | ............ G01R 35/00 |
| JP | 6-281690 A | | 7/1994 | |

OTHER PUBLICATIONS

NASPI Technical Report, Time Synchronization in the Electric Power System, Mar. 2017, 59 pages).*
International Search Report of PCT/CN2012/000584 dated Nov. 22, 2012.

* cited by examiner

MULTI-NODE SYNCHRONOUS ON-SITE TEST METHOD

TECHNICAL FIELD

The present invention relates to a multi-node synchronous simulation test method, belonging to technical field of power system measurement.

BACKGROUND ARTS

Interconnection of power grids in large regions, especially interconnection of "Sanhua" extra-high voltage synchronous large power grid, brings great challenges for safety, stability and reliable operation of power system. It is very important to increase test frequency of various dynamic monitoring and control systems, make the monitoring system functional, and build and improve intelligent monitoring, scheduling and control systems. At present, traditional equipment test method within power transmission and transformation station of power system and booster station of power plant is generally in situ test, i.e., connecting standard device to equipment under test in situ for voltage and current boosting, and then comparing and calculating the standard value and measured value to obtain test results; however, if such in situ test method cannot be expanded to synchronous simulation test between multiple transformer stations and booster stations of power plants, test of monitoring and control systems in large regions with multiple nodes cannot be carried out. Therefore, invention of a multi-node synchronous simulation test method for power system is of great significance for synchronous test of monitoring and control systems in large regions with multiple nodes and safe and steady operation of synchronous large power grids.

CONTENTS OF THE INVENTION

The object of the present invention is to provide a multi-node synchronous simulation test method which is suited for solving the problem of being unable to carry out synchronous test of monitoring and control systems in large regions with multiple nodes.

Technical scheme of the present invention is, with GPS time as the time reference, conducting synchronous simulation test for equipment and system under test and distributed in different sites within agreed time; remotely controlling synchronously phased simulators distributed in multiple nodes through the control center of synchronous test, synchronously outputting secondary-side AC simulation signals in unified time section, and simulating various actual operation conditions to realize monitoring and control performance test of various dynamic monitoring and control systems, ensure normal function of systems, and improve reliability level of systems.

Main equipment used in the present method consists of multiple synchronously phased simulators and the control center of synchronous test. Synchronously phased simulator is an equipment of clock standard source, available to produce three-phase AC signal of certain frequency, phase and amplitude or other fault waveform signals such as low-frequency oscillation signal through synchronous trigger with GPS pulse per second. The control center of synchronous test completes communication control over synchronously phased simulators and realizes issuance of test command for allopatric multi-node synchronously phased simulators, acquisition of standard data and test results, as well as error calculation, etc. The control center of synchronous test and synchronously phased simulators complete communication in wireless way, optional modes to adopt include GSM, CDMA or 3G, and the control center of synchronous test initiates communication handshake.

Procedure of the present invention, multi-node synchronous simulation test method is as follows:

(1) Firstly select multiple test nodes to be subject to synchronous simulation test. Principles of selection shall include at least one important node of power supply side, multiple nodes of power grid side connected to the power plant (priority given to those connected with most branches). The control center of synchronous test is allowed to be located within the scope of certain center node, or in the master station available to monitor data.

(2) Establish communication link. Synchronously phased simulator and control center of synchronous test of various nodes are subject to communication handshake. The communication handshake is initiated by the control center, and point-to-point connection between the synchronously phased simulator and control center of synchronous test is established in wireless way (including GSM, CDMA, or 3G).

(3) Carry out system time synchronization to ensure time synchronization of systems.

There are three types of system time synchronization:

1) Time synchronization of GPS time device. After determining communication delay of various nodes, it is required to verify correctness of GPS time device of various nodes and guarantee time difference between various nodes within the specified scope, which is the most fundamental time synchronization.

2) Time synchronization of command communication. After determining correctness of GPS time device of various nodes, it is required to determine the command transmission delay between various nodes. That is, command feedback must be given after various nodes receiving time synchronization command from the control center, where the feedback contents must include command receiving time and feedback time to determine command transmission delay of various nodes, which must be based on to issue the command in advance after simulation test command is issued.

3) Time synchronization of simulation test command. Various nodes are connected through the electric power circuit; since inconsistency of line parameters of each electric power circuit inevitably leads to inconsistency of AC simulation signal values of various nodes in the same time section, the sequential relationship between AC simulation signal values of various nodes must be determined, i.e., AC simulation signal values of various nodes in various time sections, to make various nodes able to simulate actual operation condition of regional power grid practically during simulation test.

(4) Determine test scheme and test content: the control center of synchronous test issues the simulation test scheme to various simulation nodes before simulation test according to the prepared simulation test scheme, and synchronously phased simulators located in various nodes receive and respond to the test scheme. The simulation test scheme and content include: test starting time, test ending time, AC simulation signal value of various simulation test nodes in each time section, including phase, frequency and amplitude; if test content is dynamic performance test or fault simulation test, AC simulation signal parameters shall include the scope of variable parameters. After various nodes accept the simulation test scheme, the simulation test starting command is issued uniformly; synchronously phased simulators of various nodes implement simulation test content of the current node automatically during test, and transfer the output test data to the control center of synchronous test, which conducts real-time monitoring of the synchronous simulation test progress, and issues test ending command after all nodes complete simulation test content; finally analysis, calculation and comparison are conducted with actual data received by the master station system to obtain test results. Test content mainly includes:

1) Steady accuracy test, including measurement accuracy test and system synchronization accuracy test.

Measurement accuracy test content includes current, voltage, phase, frequency and other measurement accuracy tests, and measurement accuracy test of equipment under test may ensure authenticity and reliability of data uploaded to systems.

System synchronization accuracy test includes clock synchronous input signal accuracy test and punctuality accuracy test, through which system time consistency and clock punctuality capacity without clock synchronization may be ensured.

2) Transient signal test, used in case of stability disruption suffered by the simulation system, voltage instability or function test of the wide area protection system, and necessary test content including: abrupt change of voltage and current, gradual change and abrupt change of frequency, and abrupt change of phase angle.

3) Fault simulation test.

Fault simulation test is available to simulate low frequency oscillation, single/three-phase ground fault, two-phase short circuit, three-phase short circuit, metallic transient fault and single-phase permanent fault of the system, event identification of fault occurrence and correct processing capacity by the test system, recording of transient data, and whether recorded data being available to reflect the fault condition correctly.

Beneficial effects of the present invention compared with existing technologies include that: the present invention, multi-node synchronous simulation test method is a significant improvement in technical field of power system measurement, breaking through traditional in situ test method and realizing dynamic simulation test of multiple nodes and GPS time synchronization. The method of invention is available to complete function test of real-time and dynamic monitoring system of wide-area power grid (WAMS), simulation test of damping control function, simulation test of transient or steady analysis control function, simulation test of voltage stability control function, simulation test of islanding control function, simulation test of wide-area protection system function, and etc. The invention provides ideal test method for intelligent control system function of intelligent power grid, lays solid foundation for safe and steady operation of regional large power grid, and is of great significance for development of intelligent power grid.

The present invention applies to intelligent control system of intelligent power grid.

FIG. No. in drawings: 1 refers to the provincial dispatching center; 2 refers to the power plant; 3 refers to transformer station A; 4 refers to transformer station B; 5 refers to transformer station C; 6 is the bus; 7 is the communication line; 8 is the electric power circuit.

SPECIFIC MODE FOR CARRYING OUT THE INVENTION

Figure 1:
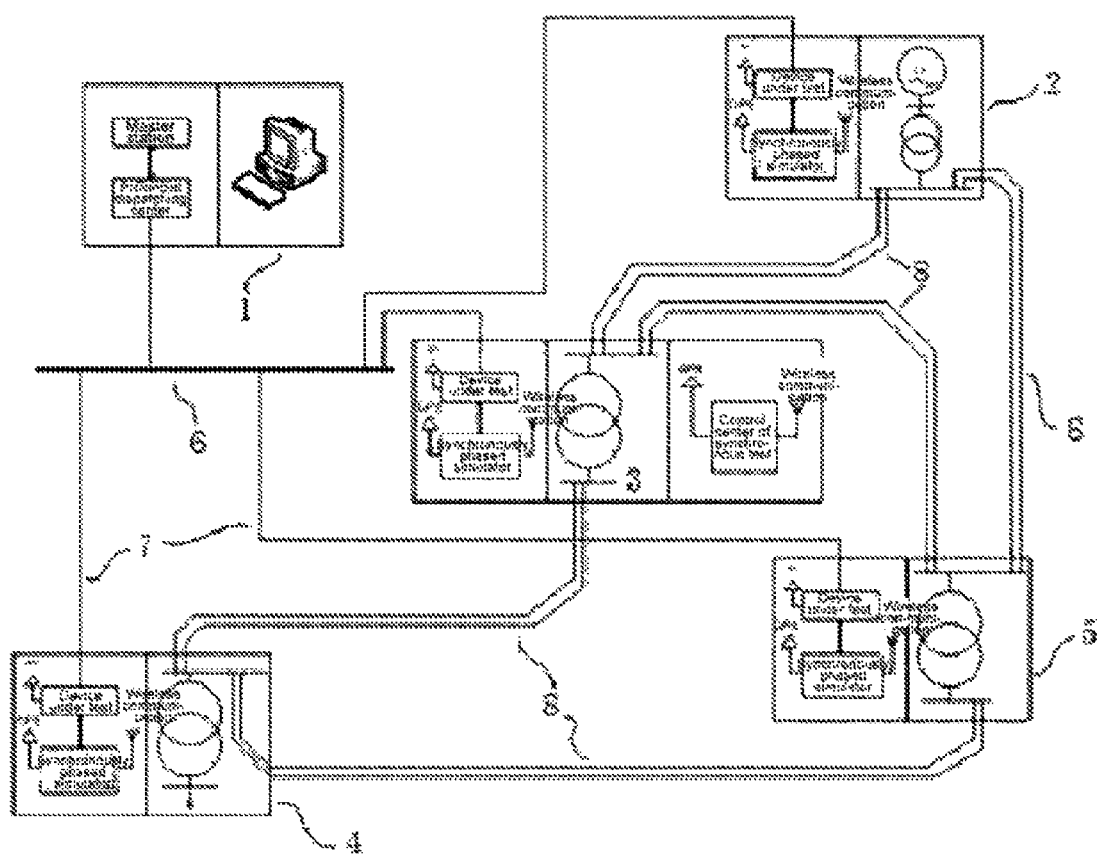
FIG. 1 schematically shows the present invention, multi-node synchronous simulation test method.
Figure 2:
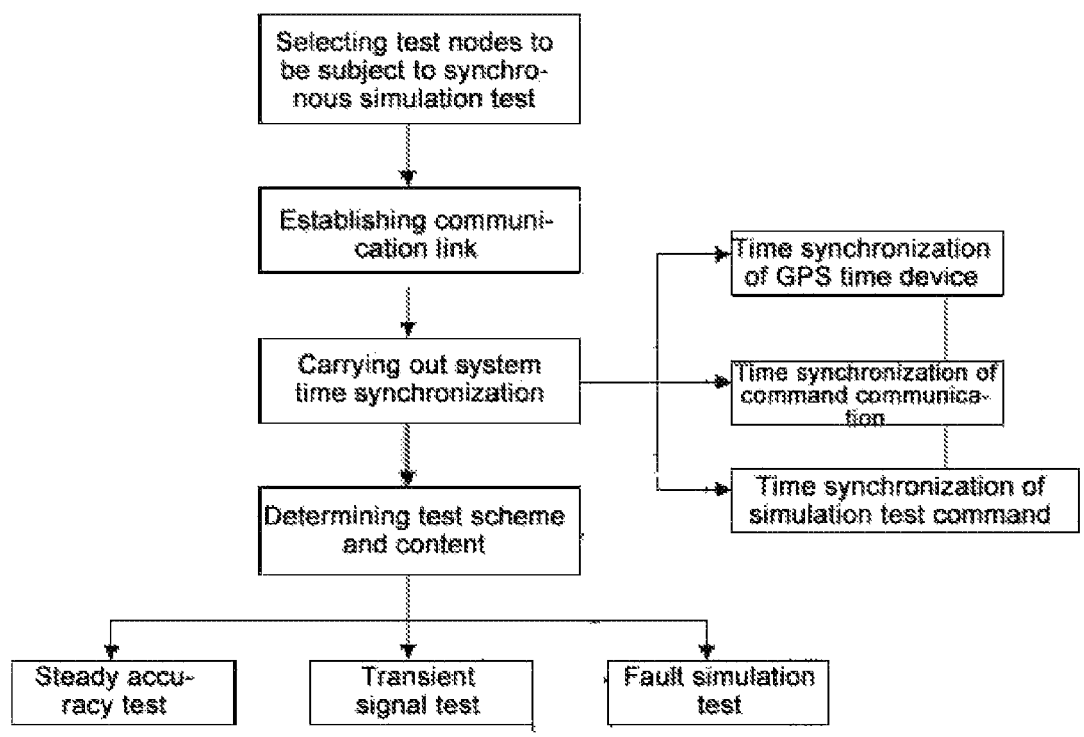
FIG. 2 is a flow block diagram showing the present invention, multi-node synchronous simulation test method.

Description of the preferred embodiment of the present invention is shown in FIGS. 1 and 2.

(1) Firstly Select Test Nodes to be Subject to Synchronous Simulation Test

In the present embodiment, an important node of power supply side, power plant 2, and three nodes of power grid side connected to power plant: transformer station A3, B4 and C5 are selected. The control center of synchronous test is located in the center node, transformer station A.

Work permit must be applied for from the provincial dispatching center 1 before carrying out site test after selecting test nodes to prevent occurrence of incorrect operation caused by simulation test. The rule of electric work tickets must be followed in case of working in electric field, and test personnel must be very familiar with actual wiring condition of devices on site before carrying out multi-node synchronous simulation test, otherwise occurrence of security incidents is easy to be caused. Since multi-node synchronous simulation test is carried out in different ends of stations, at least 3 groups of staff shall be arranged to two different nodes to carry out synchronous simulation test. In addition, before carrying out synchronous simulation test, coordination must be made with dispatching center of the grid company, and test data shall be obtained from back-end database of systems.

(2) Wiring

Connect voltage circuit and current circuit of synchronously phased simulators with those of devices under test, follow requirements of field operation instruction strictly during wiring, and strictly prohibit short circuit of voltage circuit or open circuit of current circuit.

Master station of the provincial dispatching center 1 is connected to the bus 6 through data concentrator. Communication lines of synchronously phased simulators and devices under test are connected to the bus 6.

(3) Test

1) Test devices of various nodes and the control center of synchronous test are subject to communication handshake through CDMA.

2) Test devices of various nodes, the control center of synchronous test and systems under test are subject to standard time synchronization.

3) The control center issues simulation test scheme based on test purpose.

4) Various nodes confirm the simulation test scheme and content, and the control center issues test starting command after receiving acceptance response from all nodes.

5) Various nodes conducts test item by item for test content within specified time according to requirements of the simulation test scheme, and implement simulation test content of the present node automatically. During test, test personnel must monitor the test site to prevent man-made or environmental interference upon test.

6) Compare test date of various nodes and test results of systems under test to calculate the measurement results.

7) Test devices of various nodes disconnect communication link with the synchronously phased simulation control center after it issues test ending command.

The invention claimed is:

1. A test method comprising:

A multi-node synchronous simulation test method, with a GPS time as a time reference, conducting a synchronous simulation test for an equipment and a system under test and distributed in a plurality of different sites within an agreed time, controlling a plurality of synchronously phased simulators distributed in multiple nodes through a control center, synchronously outputting a plurality of secondary-side AC simulation signals in an unified time section, and simulating a plurality of actual operation conditions to realize a monitoring and control performance test of a plurality of dynamic monitoring and control systems, ensure normal function of the system under test, and improve a reliability level of the system under test; a procedure of said methods being as follows:
(1) firstly selecting multiple test nodes to be subject to the synchronous simulation test; principles of selection including at least one node of a power supply side or multiple nodes of a power grid side connected to a power plant; the control center of the synchronous simulation test being allowed to be located within a scope of a certain center node, or in a master station available to monitor data:
(2) establishing communication link; the plurality of synchronously phased simulators and the control center of the synchronous simulation test of various nodes being subject to a communication handshake; the communication handshake being initiated by the control center, a point-to-point connection between each of the plurality of synchronously phased simulators and the control center of tire synchronous simulation test being established in a wireless way;
(3) carrying out a system time synchronization to ensure a time synchronization of the system under test; said system time synchronization including: a time synchronization of a GPS time device, a command communication, and a simulation test command;
(4) determining a simulation test scheme and a simulation test content: the simulation test scheme and the simulation content including: a test starting time, a test ending time, an AC simulation signal value of various simulation test nodes in each time section, including a phase, a frequency and a amplitude: if the simulation test content being a dynamic performance test or a fault simulation test, a plurality of AC simulation signal parameter's including the scope of a plurality of variable parameters; the simulation test content mainly including: a steady accuracy test, a transient signal test, and a fault simulation test.

2. The multi-node synchronous simulation test method according to claim 1, wherein the said steady accuracy test including a measurement accuracy test and a system synchronization accuracy test; the measurement accuracy test content including a current, a voltage, a phase, a frequency and other measurement accuracy tests; the system synchronization accuracy test including a clock synchronous input signal accuracy test and a punctuality accuracy test.

3. The multi-node synchronous simulation test method according to claim 1, wherein the said transient signal test being used in a case of a stability disruption suffered by a simulation system, a voltage instability or a function test of a wide area protection system, a necessary test content including: an abrupt change of voltage and current, a gradual change and an abrupt change of frequency, and an abrupt change of phase angle.

4. The multi-node synchronous simulation test method according to claim 1, wherein the said fault simulation test being available to simulate a low frequency oscillation, a single/three-phase ground fault, a two-phase short circuit, a three-phase short circuit, a metallic transient fault and a single-phase permanent fault of the system under test, an event identification of fault occurrence and a correct processing capacity by a synchronous simulation test system, recording of transient data, and whether recorded data being available to reflect the fault condition correctly.

* * * * *